United States Patent
Gleissner et al.

(10) Patent No.: US 9,418,883 B2
(45) Date of Patent: Aug. 16, 2016

(54) DEVICE FOR HOLDING WAFER SHAPED ARTICLES

(71) Applicant: LAM RESEARCH AG, Villach (AT)

(72) Inventors: Andreas Gleissner, Dobriach (AT); Thomas Wirnsberger, Seeboden (AT)

(73) Assignee: LAM RESEARCH AG, Villach (AT)

( * ) Notice: Subject to any disclaimer, the term of this patent is extended or adjusted under 35 U.S.C. 154(b) by 433 days.

(21) Appl. No.: 13/935,068

(22) Filed: Jul. 3, 2013

(65) Prior Publication Data

US 2015/0008632 A1    Jan. 8, 2015

(51) Int. Cl.
| | | |
|---|---|---|
| H01L 21/687 | (2006.01) | |
| H01L 21/67 | (2006.01) | |
| B08B 3/04 | (2006.01) | |
| B08B 11/02 | (2006.01) | |
| F16D 27/09 | (2006.01) | |

(52) U.S. Cl.
CPC .... H01L 21/68728 (2013.01); H01L 21/68721 (2013.01); B08B 3/04 (2013.01); B08B 11/02 (2013.01); F16D 27/09 (2013.01); H01L 21/67023 (2013.01); H01L 21/67069 (2013.01)

(58) Field of Classification Search
CPC ............ H01L 21/687; H01L 21/67069; H01L 21/67017; H01L 21/67023; H01L 21/67028; H01L 21/287; H01L 21/67; B08B 3/04; B08B 11/02; F16D 27/09; F16D 27/00; F16D 27/10; F16D 41/02; F16D 41/12; F16D 41/125
USPC ....... 269/66, 225–227, 229, 231, 236, 254 R, 269/254 SC, 903; 475/346, 347
See application file for complete search history.

(56) References Cited

U.S. PATENT DOCUMENTS

| | | | |
|---|---|---|---|
| 4,903,717 A | | 2/1990 | Sumnitsch |
| 5,513,668 A | | 5/1996 | Sumnitsch |
| 5,989,342 A | * | 11/1999 | Ikeda ...................... B05C 11/08 118/319 |
| 6,374,836 B1 | * | 4/2002 | Oroku ...................... B08B 3/04 134/140 |
| 6,485,531 B1 | | 11/2002 | Schob |
| 6,786,996 B2 | * | 9/2004 | Emami ............... H01L 21/6708 156/345.1 |
| 8,608,146 B2 | * | 12/2013 | Brugger ............ H01L 21/68757 269/21 |
| 8,646,767 B2 | * | 2/2014 | Kumnig ............ H01L 21/68728 269/225 |

(Continued)

OTHER PUBLICATIONS

Brydson, J. (1999). Plastics Materials (7th Edition)—13.5 Polychlorotrifluoroethylene Polymers (PCTFE) and Copolymers with Ethylene (ECTFE). Elsevier.*

(Continued)

*Primary Examiner* — Monica Carter
*Assistant Examiner* — Mahdi H Nejad
(74) *Attorney, Agent, or Firm* — Young & Thompson

(57) ABSTRACT

A device for holding a wafer-shaped article comprises an annular chuck base body having a plurality of movable contact elements for securing a wafer-shaped article to the annular chuck base body, and a gear mechanism driving the contact elements in unison between a first position and a second position. The annular chuck base body comprises a housing formed from a material that is resistant to attack by strong inorganic acids. The annular chuck base body also comprises a reinforcing ring fitted within the housing and formed from a material whose coefficient of linear thermal expansion is substantially less than that of the housing material.

18 Claims, 3 Drawing Sheets

(56) References Cited

U.S. PATENT DOCUMENTS

| | | | |
|---|---|---|---|
| 8,709,165 B2* | 4/2014 | Okorn-Schmidt | H01L 21/67115 134/18 |
| 8,791,614 B2* | 7/2014 | Obweger | H01L 21/683 310/103 |
| 9,255,614 B2* | 2/2016 | Kimes | F16D 27/09 |
| 2004/0047720 A1* | 3/2004 | Lerner | H01L 21/68 414/781 |
| 2004/0065354 A1* | 4/2004 | Ishizaki | B08B 3/04 134/30 |
| 2011/0250044 A1* | 10/2011 | Obweger | H01L 21/683 414/757 |
| 2011/0254236 A1* | 10/2011 | Brugger | H01L 21/6838 279/125 |
| 2012/0018940 A1* | 1/2012 | Kumnig | H01L 21/68728 269/225 |

OTHER PUBLICATIONS

The engineering toolbax, Coefficients of Linear Thermal Epansion Table, 2012.*

* cited by examiner

DEVICE FOR HOLDING WAFER SHAPED ARTICLES

BACKGROUND OF THE INVENTION

The invention relates to devices for holding wafer-shaped articles, such as semiconductor wafers.

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903, 717 and 5,513,668.

The patents referenced above operate on the Bernoulli principle, such that the wafer receives subjacent support from a gas cushion rather than by contact with the chuck. Such chucks nevertheless ordinarily include a circular series of pins that are positioned radially outwardly of a wafer positioned on the chuck. Those pins prevent lateral displacement of the wafer relative to the chuck.

Other spin chucks operate under control of magnetic fields, by fashioning the chuck body as a magnetic rotor positioned coaxially within a surrounding annular magnetic stator, as described for example in U.S. Pat. No. 6,485,531. In such chucks the magnetic rotor supports the wafer. Commonly-owned co-pending application U.S. Pub. No. 2012/0018940 describes magnetic rotor designs that better withstand the often extreme temperatures to which such chucks are exposed in use. However, the present inventors have discovered that there remains a need for improved chuck designs that are less adversely influenced by higher temperature use conditions.

SUMMARY OF THE INVENTION

Thus, in one aspect, the present invention relates to a device for holding a wafer-shaped article, comprising an annular chuck base body having a plurality of movable contact elements for securing a wafer-shaped article to the annular chuck base body, and a gear mechanism driving the contact elements in unison between a first position in which they contact a wafer-shaped article positioned on the device, and a second non-contact position. The annular chuck base body comprises a housing formed from a material that is resistant to attack by strong inorganic acids, and the annular chuck base body comprises a reinforcing ring fitted within the housing and formed from a material whose coefficient of linear thermal expansion is substantially less than that of the housing material.

In preferred embodiments of the device according to the present invention, the housing is formed from a material whose coefficient of linear thermal expansion is at least twice that of the reinforcing ring material, preferably at least three times greater, and more preferably at least five times greater.

In preferred embodiments of the device according to the present invention, the reinforcing ring is formed from steel, and wherein the housing is formed from a plastic selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), ethylene chlorotrifluoroethylene (ECTFE) and polypropylene (PP).

In preferred embodiments of the device according to the present invention, the gear mechanism and the reinforcing ring are formed from materials whose coefficients of linear thermal expansion differ from one another by not more than 50% and preferably by not more than 20%.

In preferred embodiments of the device according to the present invention, the gear mechanism and the reinforcing ring are formed from a same material.

In preferred embodiments of the device according to the present invention, the gear mechanism and the reinforcing ring are each formed from stainless steel.

In preferred embodiments of the device according to the present invention, the gear mechanism and the reinforcing ring are formed from different materials, each of which is a metal.

In preferred embodiments of the device according to the present invention, the gear mechanism is formed from aluminum and the reinforcing ring is formed from stainless steel.

In preferred embodiments of the device according to the present invention, the contact elements are embodied in a circular series of pin assemblies that are conjointly movable from the second position to the first position, and the gear mechanism comprises a gear ring having gear teeth in continuous meshing engagement with gear teeth provided on a base portion of each of the pin assemblies.

In preferred embodiments of the device according to the present invention, the base body carries a plurality of rollers rotatable about axes parallel to the axis of rotation of the base body, each of the rollers being positioned radially outwardly of a corresponding one of the plurality of pin assemblies, with a respective section of gear teeth of the ring gear being positioned therebetween.

In preferred embodiments of the device according to the present invention, each of the rollers comprises an elastically deformable contact material bearing on a surface of the ring gear.

In preferred embodiments of the device according to the present invention, the pin assemblies each comprise a pin projecting from a respective pivotal base along an axis parallel to and offset from a pivot axis of the pivotal base.

In preferred embodiments of the device according to the present invention, the gear ring teeth are formed on a radially inward edge thereof.

In preferred embodiments of the device according to the present invention, the reinforcing ring comprises arcuate guide slots for guiding the ring gear in rotation relative to the annular chuck base body over a predetermined angular range.

In preferred embodiments of the device according to the present invention, the reinforcing ring comprises a multiplicity of threaded bores for receiving correction weights for balancing the annular chuck base body.

In preferred embodiments of the device according to the present invention, the annular chuck base is a magnetic rotor of a magnetic bearing and drive unit, the device further comprises a chamber in which the magnetic rotor is positioned, and the magnetic rotor and drive unit further comprises a stator positioned outside of the chamber and facing the magnetic rotor across a wall of the chamber.

In preferred embodiments of the device according to the present invention, the contact elements depend downwardly from the annular chuck base body, such that a wafer-shaped article is suspended from the annular chuck base body when mounted in the device.

In preferred embodiments of the device according to the present invention, the housing of the annular chuck base body comprises a main section having openings to receive the contact elements, an upper outer section housing magnets, and a lower outer section in which the reinforcing ring is fitted.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
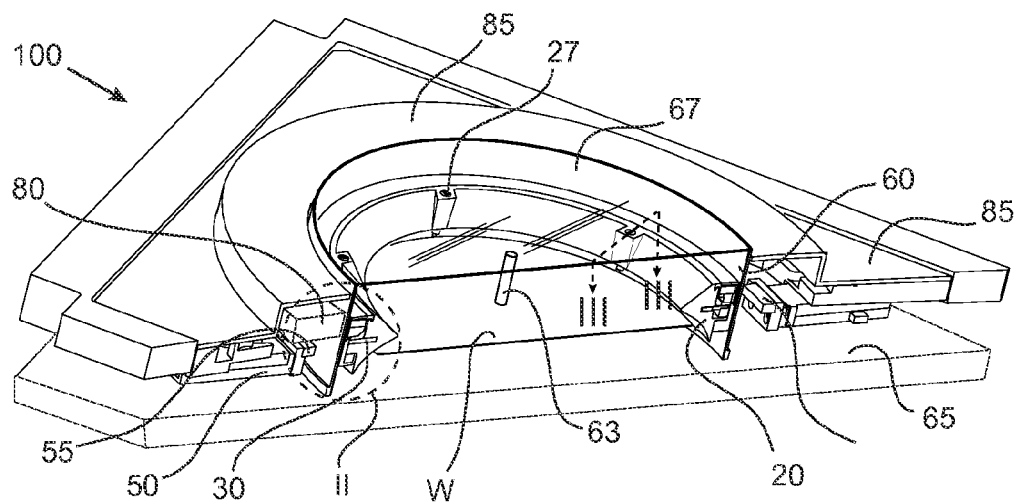
FIG. 1 is a perspective view, partly in section, illustrating a device according to one embodiment of the invention.

The device 100 of FIG. 1 comprises a chamber, an annular chuck 20 positioned within the chamber for gripping and rotating a wafer W, and a stator 80. The chamber comprises a cylindrical wall 60, a bottom plate 65 and a preferably transparent top plate 67. One or more upper dispensing tubes, indicated schematically at 63, are led through the top plate 67 and one or more lower dispensing tubes (not shown) are led through the bottom plate 65.

Stator 80 is mounted to a stator base plate 85 and is concentric with the cylindrical wall 60. The stator base plate 85 can be moved axially along the axis of the cylindrical wall 60, e.g. with pneumatic lifting devices. Alternatively, the stator base plate 85 may be mounted in a stationary manner and the bottom plate 65 with cylindrical wall 60 mounted thereon can be moved axially relative to the stationary stator 80, e.g. with pneumatic lifting devices. The stator base plate 85 and the stator 80 mounted thereto have central openings, whose diameter is greater than the outer diameter of the cylindrical wall 60. The top plate 67 can also be moved axially to open the chamber, either manually or by a suitable mechanism (not shown). In its closed position the top plate is sealed against the cylindrical wall 60.

The stator 80 comprises several coils (not shown) for changing the radial and optionally also the axial orientation of the chuck 20, as well as for driving the chuck in rotation. Such an arrangement is further described in U.S. Pat. No. 6,485,531. The diameter of the annular chuck 20 is less than the inner diameter of the cylindrical wall 60 so that it can freely levitate and rotate within the cylindrical wall 60. The annular chuck 20 comprises a chuck base body with an annular groove circumferentially surrounding the outside of the inner chuck base body, with the annular groove receiving the gear ring 30. The gear ring 30 is preferably made of aluminum or stainless steel. The gear ring 30 drives a circular series of pin assemblies 27, of which there are six in this embodiment, and only three of which are visible in FIG. 1.

Each pin assembly 27 is rotatable relative to the chuck base body 21 via the gear ring 30, about axes parallel to the axis of rotation of the chuck. The pin assemblies terminate downwardly in contact elements positioned so as to contact a wafer W on its peripheral edge. As the pins assemblies 27 also support the weight of the wafer W, the contact portions thereof may either be cylindrical in shape or have recessed portions on their radially inwardly facing sides contacting the wafer edge, to prevent axial displacement of the wafer W relative to the pin assemblies 27 when the wafer is being gripped.

Figure 2:
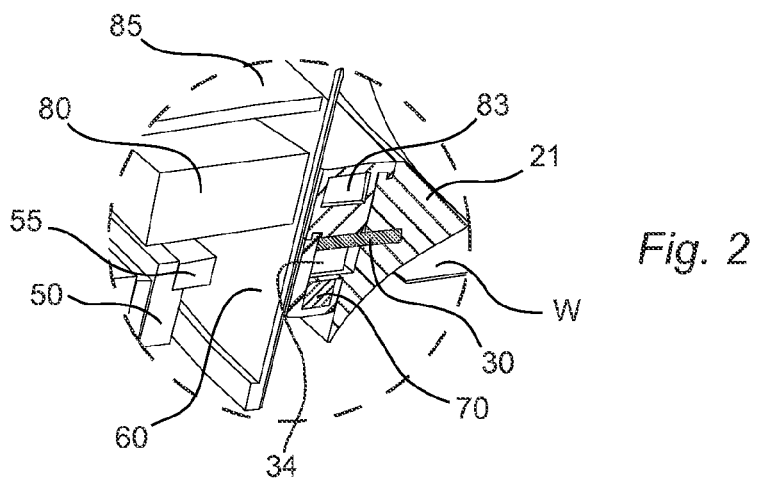
FIG. 2 is a perspective view, also partly in section, of the detail II designated in FIG. 1.

As shown in FIG. 2, a plurality of rotor magnets 83, which are permanent magnets, are evenly arranged around the chuck base body 21. These rotor magnets 83, which are preferably at least 24 in number, are part of the drive and positioning unit, namely, part of the rotor (elements of the active bearing), which is mounted to the chuck base body 21.

The plurality of rotor magnets 83 and the gear ring 30 carrying the permanent magnets 33 are housed within chuck base body 21, outer lower chuck cover 23, and the rotor magnet cover 25. Such rotor magnet cover 25 can be a stainless steal jacket. The covers 23 and 25 are annular and concentric with the chuck base body 21. Two permanent magnets 33 are mounted to the gear ring 30.

When the pins are to be opened e.g. to release a wafer the following procedure is conducted: the stator 80 is moved upwardly relative to chamber wall 60 (either by raising the stator or lower the chamber wall, or both) so that the chuck 20 is lifted such that the cylindrical wall 60 is no longer in the gap between the locking magnets 55 and the chuck 20. Thereafter the pneumatic cylinders 50 move the locking magnets 55 in close proximity to the chuck 20 and the chuck is turned so that the permanent magnets 33 and therewith the gear ring 30 is locked by the locking magnets. Now the chuck is turned while the gear ring stands still and thus the pins 28 open. Alternatively the chuck base body might stand still while the pneumatic cylinders are moved so that the locking magnets tangentially turn (along the circumference of the chuck), whereby the gear ring is turned.

Figure 3:
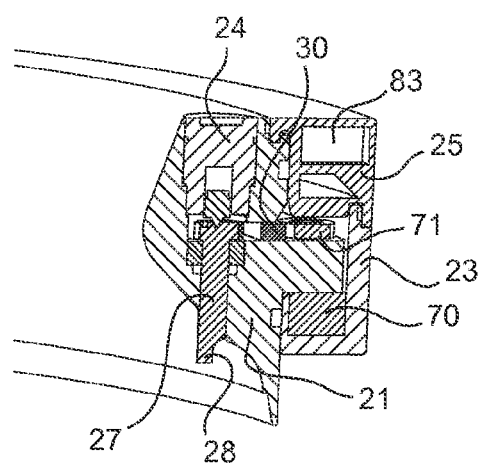
FIG. 3 is a perspective view, also partly in section, taken along the line III-III of FIG. 1.

Turning now to FIG. 3, the structure of pin assembly 27 and its associated contact element 28 is shown in greater detail. Also shown in FIG. 3 are the chuck base body 21 in which the pin assembly is fitted, the magnet holder 25 containing the rotor magnets 83, the ring gear 30 in continuous meshing engagement with the gear teeth of the pin assembly 21, a reinforcing ring 70 that is fitted with the outer lower chuck cover 23, and a roller 71 whose function will be described below.

The housing components 21, 23, 25 making up the chuck 20 are each preferably formed of an engineering plastic that is highly resistant to the strong mineral acids commonly used during processing of semiconductor wafers. For example, these components are preferably made from one or more materials selected from the group consisting of polytetrafluoroethylene (PTFE), perfluoroalkoxy (PFA), polyphenylene-sulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), ethylene chlorotrifluoroethylene (ECTFE) and polypropylene (PP). Among these materials, PVDF (polyvinylidene fluoride) and ECTFE (ethylene-chlorotrifluoroethylene) are particularly preferred.

On the other hand, the gear ring 30 and reinforcing ring 70 are made from a material that has a significantly greater resistance to thermal expansion than do the plastic housing components 21, 23, 25. In particular, ring gear 30 and reinforcing ring 70 are preferably each made of stainless steel. Ring gear 30 and reinforcing ring 70 may also be made of different materials; however, in that case, it is preferred that their respective coefficients of linear thermal expansion differ from one another by less than 50%, and preferably less than 20%.

It is preferred that at least the reinforcing ring 30 be made of a material whose coefficient of linear thermal expansion is not more than half that of the housing components, preferably not more than one third, and more preferably not more than one fifth.

In the present disclosure, coefficients of linear thermal expansion are expressed in units of m/mK. Thus, for example, stainless steel has a reported linear temperature expansion coefficient of 17.3 ($10^{-6}$ m/mK), whereas stainless steel has a reported linear temperature expansion coefficient of 17.3 ($10^{-6}$ m/mK), whereas polyvinylidene fluoride (PVDF) has a reported linear temperature expansion more than seven times greater, 127.8 ($10^{-6}$ m/mK).

Figure 4:
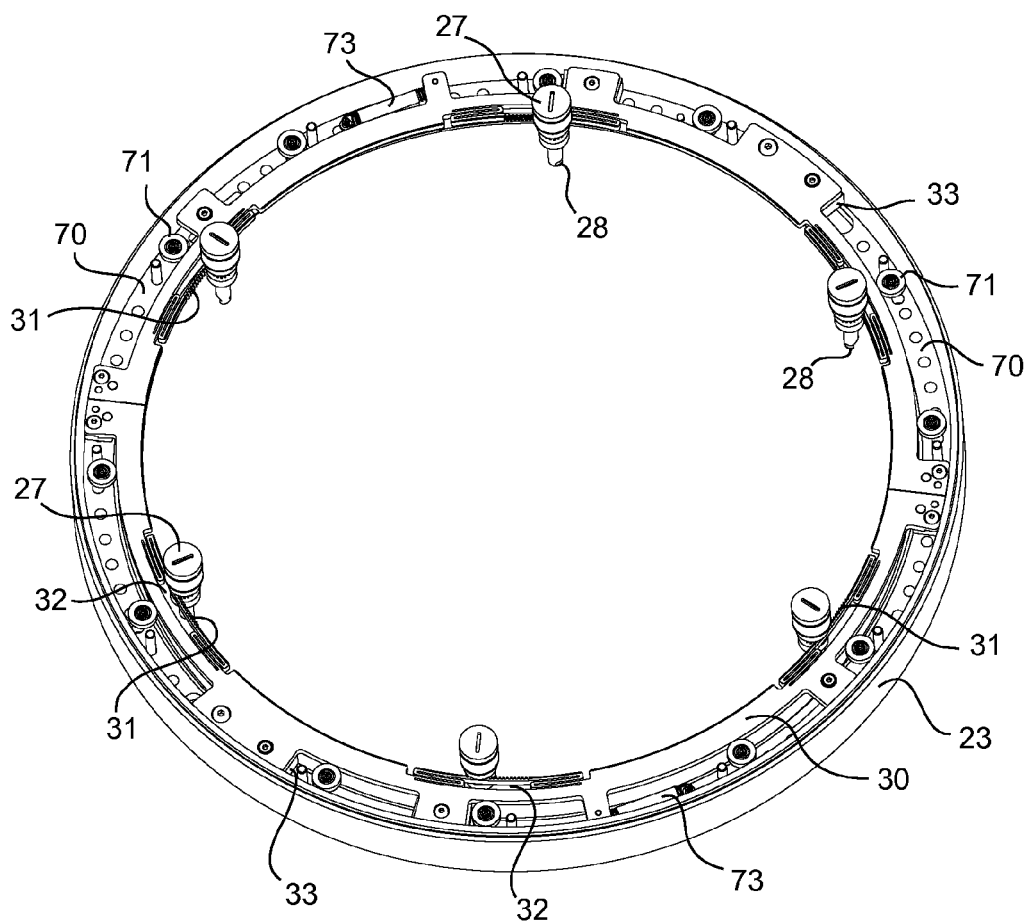
FIG. 4 is a perspective view of the device of FIG. 1 with the main and upper outer housing components removed so as to reveal the internal mechanisms of the device.

As shown in FIG. 4, gear ring 30 comprises six regions of inwardly facing teeth 31. The inwardly facing teeth 31 in turn drive the teeth of a pin assembly 27. A pin 28 is mounted to or formed integrally with each pin assembly 27, at a position that is eccentric with respect to the axis of rotation of the pin assembly 27. Consequently, the pins 28 are displaced radially of the chuck when the pin shafts 27 are turned by the gear ring 30. As the pins and the gear ring 30 are both carried by the chuck base body 21, the pins shafts 27 are rotated by the gear ring 30 only when the gear ring 30 rotates relative to the chuck base body.

In order to mount the gear ring 30 into the annular groove of the chuck base body 21 the gear ring 30 consists of two separate segments, which are fixed together when inserted into the annular groove. The chuck base body 21 and the gear ring 30 are connected via one or more helical springs 73 so that the gear ring 30 urges the pins 28 into their radially innermost positions, corresponding to the gripping of a wafer W.

When assembling the chuck 20 the pin shafts 27 are inserted from above into their respective seats so that the pin shafts tightly seal against the chuck base body 21 as shown in FIG. 3. Additionally there is a dynamic sealing acting between pin shaft and base body. Each pin shaft 27 is fixed in position with a screw 24. Additionally, each pin shaft may be pressed into its seat by a helical spring between the pin shaft and the screw.

In FIG. 4, behind each set of teeth 31 there is an enclosed cut-out 32 that defines a narrower region of ring gear 30 that is thereby significantly weakened, as described in commonly-owned co-pending application U.S. Pub. No. 2012/0018940. The material of the ring gear 30 has sufficient elasticity that the narrower region will deflect radially outwardly upon thermal expansion of chuck base body 21 and associated displacement of pin assembly 27, yet will return to its initial position as the chuck base body 21 cools and contracts.

However, the present inventors have discovered that, during processes conducted at elevated temperatures, such as 80° C., a chuck with a base body of ECTFE and an aluminum or stainless steel gear ring, made as described in commonly-owned co-pending application U.S. Pub. No. 2012/0018940, would expand such that there would result a reduction of pin clamping forces, and in some cases, of chuck open/close malfunctions. In a worst case scenario this could result in a wafer being irreparably damaged.

The reinforcing ring 70 prevents this undesired expansion of the chuck, while also improving the design of the device in other ways. In particular, the reinforcing ring 70 significantly increases the stiffness of the entire chuck assembly and reduces the expansion of the chuck main body 21.

Additionally, as shown in FIG. 4, the base body 21 carries a series of rollers 71. These rollers 71 serve as counterpart to the pin assemblies 27 so that the ring gear 30, which drives the pins, is prevented from being excessively deformed, especially in the regions where the ring gear 30 is thinned by the cut-outs 32.

However, it was also observed that when such a chuck was used at temperatures in excess of 100° C., expansion of the ring gear 30 toward the rollers 71 caused the rollers 71 to be contacted with sufficient pressure that they would not rotate. Therefore, rollers 71 are preferably equipped with a relatively soft material with which to contact the ring gear 30, such as rubber. This arrangement permits the ring gear 30 to expand without seizing of the rollers 71.

Figure 5:
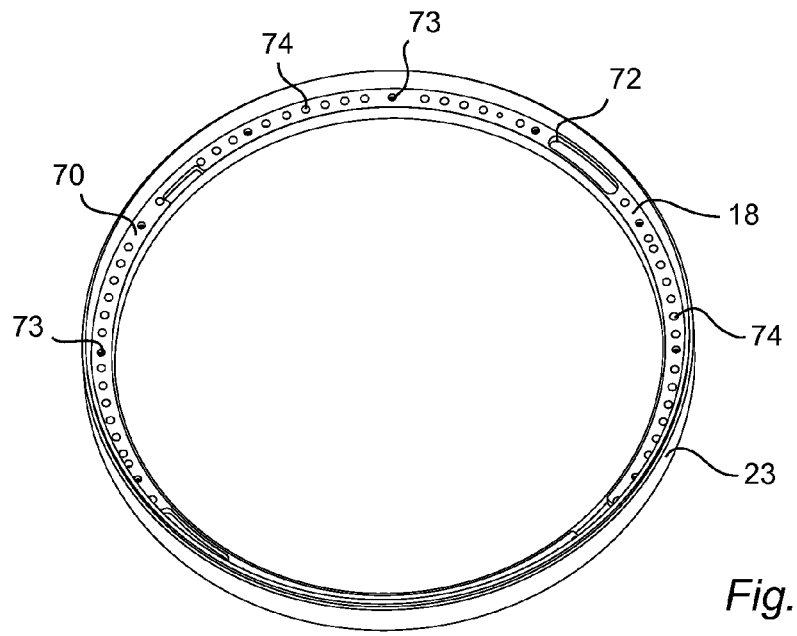
FIG. 5 is a perspective view of the reinforcing ring of the FIG. 1 embodiment fitted in the lower outer housing component.
Figure 6:
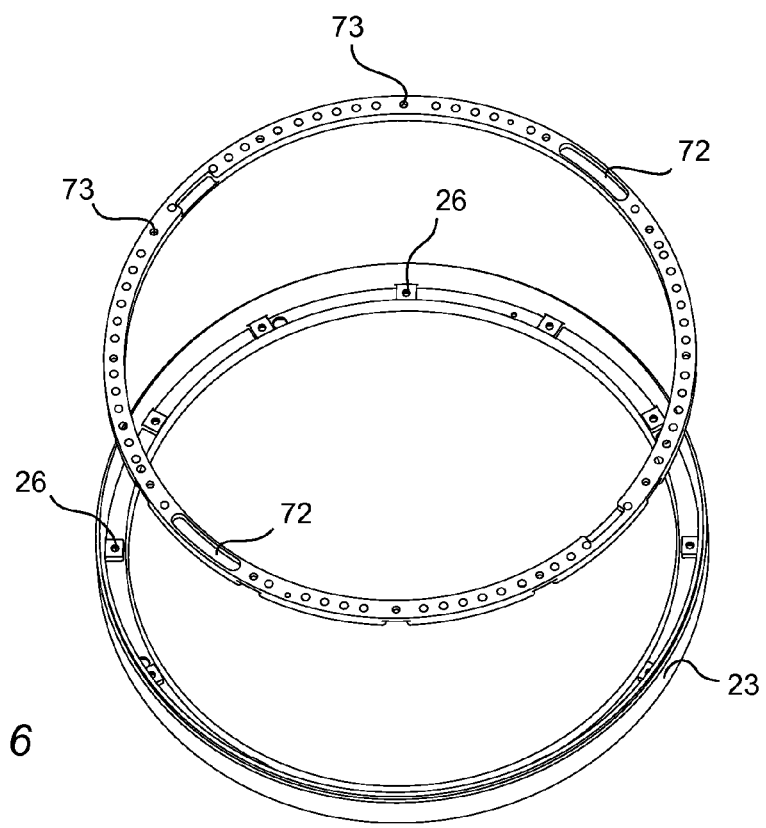
FIG. 6 is an exploded view of the components shown in FIG. 5.

As shown in FIGS. 5 and 6, the reinforcing ring is provided with twelve through bores 73 that align with bores on the outer lower chuck cover 23 such that the reinforcing ring 70 may be fixed in position relative to the outer lower chuck cover 23 (as well as chuck base body 21 and magnet cover 25). The reinforcing ring 70 also includes a pair of opposed arcuate openings or recesses 72, which receive a downwardly projecting roller (not shown) on the ring gear 30, so as to guide the ring gear across its limited angular range of motion relative to the chuck, and against the action of springs 73.

The reinforcing ring furthermore includes a multiplicity of additional bores 74. Selected ones of these additional bores 74 may be used to accommodate one or more correction weights, to aid in spin-balancing the rotary chuck.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A device for holding a wafer-shaped article, comprising an annular chuck base body having a plurality of movable contact elements for securing a wafer-shaped article to said annular chuck base body, and a gear mechanism driving the contact elements in unison between a first position in which they contact a wafer-shaped article positioned on the device, and a second non-contact position, wherein the annular chuck base body comprises a housing formed from a material that is resistant to attack by strong inorganic acids, and wherein said annular chuck base body comprises a reinforcing ring fitted within said housing and formed from a material whose coefficient of linear thermal expansion is substantially less than that of said housing material, said reinforcing ring surrounding an inner edge of said housing.

2. The device according to claim 1, wherein said housing is formed from a material whose coefficient of linear thermal expansion is at least twice that of said reinforcing ring material.

3. The device according to claim 1, wherein said gear mechanism and said reinforcing ring are formed from materials whose coefficients of linear thermal expansion differ from one another by not more than 50%.

4. The device according to claim 1, wherein said gear mechanism and said reinforcing ring are formed from different materials, each of which is a metal.

5. The device according to claim 4, wherein said gear mechanism is formed from aluminum and said reinforcing ring is formed from stainless steel.

6. The device according to claim 1, wherein said contact elements are embodied in a circular series of pin assemblies that are conjointly movable from said second position to said first position, and wherein said gear mechanism comprises a gear ring having gear teeth in continuous meshing engagement with gear teeth provided on a base portion of each of said pin assemblies.

7. The device according to claim 6, wherein said base body carries a plurality of rollers rotatable about axes parallel to the axis of rotation of said base body, each of said rollers being positioned radially outwardly of a corresponding one of said plurality of pin assemblies, with a respective section of gear teeth of said gear ring being positioned therebetween.

8. The device according to claim 7, wherein each of said rollers comprises an elastically deformable contact material bearing on a surface of said gear ring.

9. The device according to claim 6, wherein said pin assemblies each comprise a pin projecting from a respective pivotal base along an axis parallel to and offset from a pivot axis of said pivotal base.

10. The device according to claim 6, wherein said gear ring teeth are formed on a radially inward edge thereof.

11. The device according to claim 6, wherein said reinforcing ring comprises arcuate guide slots for guiding said gear ring in rotation relative to said annular chuck base body over a predetermined angular range.

12. The device according to claim 1, wherein said reinforcing ring comprises a multiplicity of threaded bores for receiving correction weights for balancing said annular chuck base body.

13. The device according to claim 1, wherein said annular chuck base is a magnetic rotor of a magnetic bearing and drive unit, said device further comprising a chamber in which said magnetic rotor is positioned, and said magnetic rotor and drive unit further comprising a stator positioned outside of said chamber and facing said magnetic rotor across a wall of said chamber.

14. The device according to claim 1, wherein said contact elements depend downwardly from said annular chuck base body, such that a wafer-shaped article is suspended from said annular chuck base body when mounted in said device.

15. The device according to claim 1, wherein said housing of said annular chuck base body comprises a main section having openings to receive said contact elements, an upper outer section housing magnets, and a lower outer section in which said reinforcing ring is fitted.

16. A device for holding a wafer-shaped article, comprising an annular chuck base body having a plurality of movable contact elements for securing a wafer-shaped article to said annular chuck base body, and a gear mechanism driving the contact elements in unison between a first position in which they contact a wafer-shaped article positioned on the device, and a second non-contact position, wherein the annular chuck base body comprises a housing formed from a material that is resistant to attack by strong inorganic acids, and wherein said annular chuck base body comprises a reinforcing ring fitted within said housing and formed from a material whose coefficient of linear thermal expansion is substantially less than that of said housing material, wherein said reinforcing ring is formed from steel, and wherein said housing is formed from a plastic selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), ethylene chlorotrifluoroethylene (ECTFE) and polypropylene (PP).

17. A device for holding a wafer-shaped article, comprising an annular chuck base body having a plurality of movable contact elements for securing a wafer-shaped article to said annular chuck base body, and a gear mechanism driving the contact elements in unison between a first position in which they contact a wafer-shaped article positioned on the device, and a second non-contact position, wherein the annular chuck base body comprises a housing formed from a material that is resistant to attack by strong inorganic acids, and wherein said annular chuck base body comprises a reinforcing ring fitted within said housing and formed from a material whose coefficient of linear thermal expansion is substantially less than that of said housing material, wherein said gear mechanism and said reinforcing ring are formed from a same material.

18. The device according to claim 17, wherein said gear mechanism and said reinforcing ring are each formed from stainless steel.

\* \* \* \* \*